[12] United States Patent
Tanaka

(10) Patent No.: US 11,276,835 B2
(45) Date of Patent: Mar. 15, 2022

(54) METHOD OF MANUFACTURING LIGHT EMITTING DEVICE AND LIGHT EMITTING DEVICE

(71) Applicant: PIONEER CORPORATION, Tokyo (JP)

(72) Inventor: Akihiro Tanaka, Kawasaki (JP)

(73) Assignee: PIONEER CORPORATION, Tokyo (JP)

( * ) Notice: Subject to any disclaimer, the term of this patent is extended or adjusted under 35 U.S.C. 154(b) by 754 days.

(21) Appl. No.: 16/081,851

(22) PCT Filed: Mar. 1, 2016

(86) PCT No.: PCT/JP2016/056182
§ 371 (c)(1),
(2) Date: Aug. 31, 2018

(87) PCT Pub. No.: WO2017/149635
PCT Pub. Date: Sep. 8, 2017

(65) Prior Publication Data
US 2021/0217981 A1    Jul. 15, 2021

(51) Int. Cl.
H01L 51/50    (2006.01)
H01L 51/56    (2006.01)

(52) U.S. Cl.
CPC ...... H01L 51/5056 (2013.01); H01L 51/5092 (2013.01); H01L 51/56 (2013.01)

(58) Field of Classification Search
CPC .. H01L 51/5056; H01L 51/56; H01L 51/5092
See application file for complete search history.

(56) References Cited

U.S. PATENT DOCUMENTS 8,471,463 B2    6/2013    Sumida et al.
8,803,853 B2    8/2014    Seo et al.
(Continued)

FOREIGN PATENT DOCUMENTS

JP    2006-196188 A    7/2006
JP    2012-142365 A    7/2012
(Continued)

OTHER PUBLICATIONS

International Search Report for related International Application No. PCT/JP2016/056182; dated May 31, 2016; 2 pages.

Primary Examiner — Kyoung Lee
Assistant Examiner — Christina A Sylvia
(74) Attorney, Agent, or Firm — Procopio, Cory, Hargreaves & Savitch LLP

(57) ABSTRACT

A light emitting device (10) includes a hole injection layer (121), a hole transport layer (122), and a light emitting layer (123). The hole transport layer (122) includes a first organic layer (122a), a second organic layer (122b), and a third organic layer (122c). The first organic layer (122a) is formed on the hole injection layer (121) and includes a first hole transporting material. The second organic layer (122b) is formed on the first organic layer (122a) and includes a second hole transporting material. The third organic layer (122c) is formed on the second organic layer (122b) and includes the second hole transporting material. The second organic layer (122b) is formed by using a coating method, and the third organic layer (122c) is formed by a vapor deposition method.

4 Claims, 10 Drawing Sheets

(56) References Cited

U.S. PATENT DOCUMENTS

| | | | |
|---|---|---|---|
| 8,823,255 B2 | 9/2014 | Yoshinaga et al. | |
| 9,024,521 B2 | 5/2015 | Yoshinaga et al. | |
| 9,461,258 B2 | 10/2016 | Seo et al. | |
| 2002/0037427 A1* | 3/2002 | Taguchi | H01L 51/0059 428/690 |
| 2004/0251459 A1* | 12/2004 | Cina | H01L 51/5012 257/40 |
| 2005/0173700 A1* | 8/2005 | Liao | H01L 27/3211 257/40 |
| 2006/0017377 A1* | 1/2006 | Ryu | H01L 51/5265 313/504 |
| 2006/0088729 A1* | 4/2006 | Begley | H05B 33/14 428/690 |
| 2007/0008257 A1 | 1/2007 | Seo et al. | |
| 2007/0231596 A1* | 10/2007 | Spindler | H01L 51/506 428/690 |
| 2010/0283041 A1* | 11/2010 | Nakamura | B82Y 10/00 257/40 |
| 2012/0223633 A1 | 9/2012 | Yoshinaga et al. | |
| 2012/0248424 A1* | 10/2012 | Sasaki | H01L 51/504 257/40 |
| 2013/0038204 A1 | 2/2013 | Sumida et al. | |
| 2013/0193418 A1 | 8/2013 | Ishikawa | |
| 2013/0234121 A1 | 9/2013 | Sonoyama | |
| 2013/0323867 A1 | 12/2013 | Yoshinaga et al. | |
| 2014/0346538 A1 | 11/2014 | Seo et al. | |
| 2017/0084672 A1 | 3/2017 | Seo et al. | |

FOREIGN PATENT DOCUMENTS

| | | |
|---|---|---|
| JP | 2012-186021 A | 9/2012 |
| JP | 2013-157277 A | 8/2013 |
| JP | 2013-179248 A | 9/2013 |
| JP | 2013-214496 A | 10/2013 |
| JP | 2014-127303 A | 7/2014 |
| WO | 2013-190636 A1 | 12/2013 |

\* cited by examiner (a)

(b)

| | EXTERNAL QUANTUM EFFICIENCY | LIFE SPAN |
|---|---|---|
| EMBODIMENT | 1 | 1 |
| COMPARATIVE EXAMPLE | 1.01 | 0.80 |

METHOD OF MANUFACTURING LIGHT EMITTING DEVICE AND LIGHT EMITTING DEVICE

CROSS-REFERENCE TO RELATED APPLICATIONS

This application is a U.S. National Stage entry of PCT Application No: PCT/JP2016/056182 filed Mar. 1, 2016, the contents of which are incorporated herein by reference.

TECHNICAL FIELD

The present invention relates to a method of manufacturing a light emitting device and a light emitting device.

BACKGROUND ART

An organic EL element is provided as one of light sources of light emitting devices such as lighting devices or display devices. The organic EL element has a configuration in which an organic layer is disposed between a first electrode and a second electrode. The organic layer has a multilayer structure in which a hole injection layer, a hole transport layer, a light emitting layer, an electron transport layer, and an electron injection layer are stacked.

Conventionally, a vacuum film formation method (for example, vapor deposition method) has been used as the method of manufacturing each layer constituting the organic layer. On the contrary, recently, a case where the organic layer is formed by a coating method is being examined. However, in the current circumstances, it is difficult to form all layers of the organic layer by a coating method. For example, Patent Document 1 discloses that a hole injection layer and a portion of a hole transport layer are formed by a coating method and the remaining portion of the hole transport layer and a light emitting layer are formed by a vapor deposition method.

Patent Document 2 also discloses forming a portion of a hole transport layer by coating and forming the remaining portion of the hole transport layer and a light emitting layer by vapor deposition. Patent Document 2 discloses also forming an electron transport layer positioned on the light emitting layer by vapor deposition.

RELATED DOCUMENT

Patent Document

[Patent Document 1] Japanese Laid-open Patent Application Publication NO. 2012-142365
[Patent Document 2] Japanese Laid-open Patent Application Publication NO. 2014-127303

SUMMARY OF THE INVENTION

Technical Problem

In the methods disclosed in Patent Documents 1 and 2, a portion (lower layer) of the hole transport layer is formed using a coating material and the remaining layer (upper layer) of the hole transport layer is formed using a vapor-deposition material. As a result obtained by examination of the inventors, it has been found that, in a case where the hole transport layer has such a configuration, hole mobility of the hole transport layer may decrease. In this case, light emission efficiency of the light emitting device is degraded.

An exemplary object of the present invention is to prevent light emission efficiency of a light emitting device from degrading in a case where a lower layer in a hole transport layer is formed of a coating material and the remaining layer of the hole transport layer is formed of a vapor-deposition material.

Solution to Problem

According to the invention described in claim 1, there is provided a method of manufacturing a light emitting device, which includes a first step of coating a hole injection material, a second step of coating a first hole transporting material after the first step, a third step of coating a second hole transporting material after the second step, a fourth step of depositing the second hole transporting material after the third step, and a fifth step of depositing a light emitting material after the fourth step.

According to the invention described in claim 7, there is provided a light emitting device which includes a hole injection layer, a first organic layer on the hole injection layer, the first organic layer including a first hole transporting material, a second organic layer on the first organic layer, the second organic layer including a second hole transporting material, a third organic layer on the second organic layer, the third organic layer including the second hole transporting material, and a light emitting layer on the third organic layer.

According to the invention described in claim 11, there is provided a light emitting device which includes a substrate, an insulating layer on the substrate, the insulating layer including a plurality of openings, a partition wall on a portion of the insulating layer positioned between adjacent openings, and a light emitting element on an inner side of each of the plurality of openings. The light emitting element includes a hole injection layer, a hole transport layer on the hole injection layer, and a light emitting layer on the hole transport layer. The hole injection layer and a portion of the hole transport layer are not formed on the partition wall and the remaining portion of the hole transport layer and the light emitting layer are formed on the partition wall.

BRIEF DESCRIPTION OF THE DRAWINGS

The above-described object, other objects, features, and advantages will become more apparent from the following description of the preferred embodiment and the accompanying drawings.

FIG. 2(a) and FIG. 2 (b) are views illustrating a method of manufacturing a light emitting unit of the light emitting device.

DESCRIPTION OF EMBODIMENTS

Hereinafter, an embodiment of the present invention will be described with reference to the drawings. In all the drawings, the same components are denoted by the same reference signs and descriptions thereof will not be repeated. In the embodiment, for example, expressions of a hole transport layer and a hole injection layer are used to mean a layer including a hole transporting material and a layer including a hole injection material, respectively.

Figure 1:
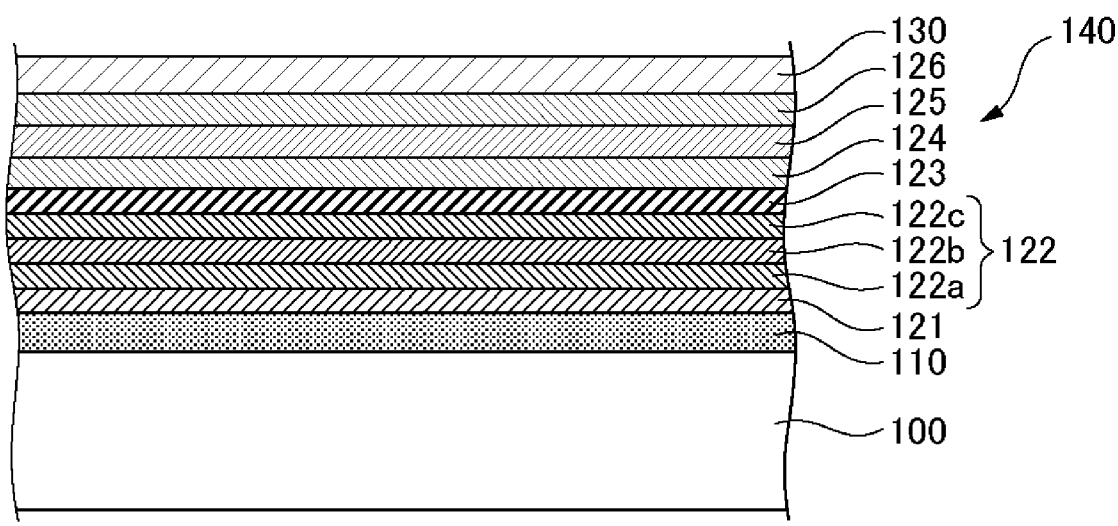
FIG. 1 is a sectional view illustrating a configuration of a light emitting device according to an embodiment.

FIG. 1 is a sectional view illustrating a configuration of alight emitting device 10 according to the embodiment. A light emitting device 10 according to the embodiment includes a hole injection layer 121, a hole transport layer 122, and a light emitting layer 123. The hole transport layer 122 includes a first hole transport layer 122a (example of a first organic layer), a second hole transport layer 122b (example of a second organic layer), and a third hole transport layer 122c (example of a third organic layer). The first hole transport layer 122a is formed on the hole injection layer 121 and includes a first hole transporting material. The second hole transport layer 122b is formed on the first hole transport layer 122a and includes a second hole transporting material. The third hole transport layer 122c is formed on the second hole transport layer 122b and includes a second hole transporting material. The light emitting layer 123 is formed on the third hole transport layer 122c. The second hole transport layer 122b is formed by using a coating method. The third hole transport layer 122c is formed by using a vapor deposition method. Therefore, an interface is provided between the second hole transport layer 122b and the third hole transport layer 122c. The refractive index of the second hole transport layer 122b is different from the refractive index of the third hole transport layer 122c. Details thereof will be described below.

The light emitting device 10 includes a light emitting unit 140. The light emitting unit 140 is formed on one surface of a substrate 100 and includes a first electrode 110, an organic layer 120, and a second electrode 130. The organic layer 120 is positioned between the first electrode 110 and the second electrode 130. The light emitting unit 140 may be bottom emission type light emitting units or top emission type light emitting units.

In a case where the light emitting unit 140 is the bottom emission type, the substrate 100 is formed of alight transmitting material such as glass or a light transmitting resin. A surface of the substrate 100 on an opposite side of the first electrode 110 serves as a light emission surface of the light emitting device 10. On the other hand, in a case where the light emitting unit 140 is the top emission type, the substrate 100 may be formed of the above-described light transmitting material or may be formed of a material which does not have light transmitting properties. The substrate 100 is, for example, a polygon such as a rectangle. The substrate 100 may have flexibility. In a case where the substrate 100 has flexibility, the thickness of the substrate 100 is, for example, equal to or greater than 10 μm and equal to or smaller than 1000 μm. In particular, in a case where the substrate 100 has flexibility by using a glass material, the thickness of the substrate 100 is equal to or smaller than 200 μm, for example. In a case where the substrate 100 has flexibility by using a resin material, the substrate is formed by a material including polyethylene naphthalate (PEN), polyethersulfone (PES), polyethylene terephthalate (PET), or polyimide, as an example of the material of the substrate 100. In a case where the substrate 100 includes a resin material, an inorganic barrier film of SiNx, SiON, or the like is formed on at least a light emitting surface (preferably, both surfaces) of the substrate 100 in order to suppress permeation of moisture through the substrate 100.

At least one of the first electrode 110 and the second electrode 130 is a transparent electrode having optical transparency. For example, in a case where the light emitting unit 140 is the bottom emission type, at least the first electrode 110 is a transparent electrode. On the other hand, in a case where the light emitting unit 140 is the top emission type, at least the second electrode 130 is a transparent electrode. Meanwhile, both the first electrode 110 and the second electrode 130 may be transparent electrodes. In this case, the light emitting unit 140 is a dual emission type light emitting unit.

A transparent conductive material constituting the transparent electrode is a material including metal, for example, a metal compound such as indium tin oxide (ITO), indium zinc oxide (IZO), indium tungsten zinc oxide (IWZO), and zinc oxide (ZnO). The thickness of the first electrode 110 is, for example, equal to or greater than 10 nm and equal to or smaller than 500 nm. The first electrode 110 is formed by, for example, using a sputtering method or a vapor deposition method. The first electrode 110 may be made of a carbon nanotube or a conductive organic material such as poly(3, 4-ethylene dioxythiophene)-poly(styrene sulfonate) (PEDOT-PSS), and may be a thin metal electrode.

The electrode which does not have light transmitting properties among the first electrode 110 and the second electrode 130 includes, for example, a metal layer formed of a metal selected from the first group consisting of Al, Au, Ag, Pt, Mg, Sn, Zn, and In, or an alloy of the metal selected from the first group. This electrode is formed by, for example, using a sputtering method or a vapor deposition method.

In a case where the light emitting unit 140 is a top emission type light emitting device, the first electrode 110 may have a structure in which a metal layer and a transparent conductive layer are stacked in this order.

The hole injection layer 121 is formed using a material through which holes move (organic material having hole mobility). The thickness of the hole injection layer 121 is, for example, equal to or greater than 50 nm and equal to or smaller than 100 nm. The hole injection layer 121 is formed by using a coating method. A material (hole injection material) forming the hole injection layer 121 is a polymer higher than the second hole transporting material, that is, has a molecular weight higher than that of the second hole transporting material. The material (hole injection material) forming the hole injection layer 121 is a conductive polymer material. For example, polythiophene-based materials such as a PEDOT-PSS are exemplified. In addition, polymeric hole injection materials including arylamine derivatives, porphyrin derivatives, polystyrene derivatives, polypyrrole derivatives, polyaniline derivatives, polythiophene derivatives, and polyacetylene derivatives can be exemplified. However, the material is not limited to the above.

The hole transport layer 122 is formed using an organic material having hole mobility. In detail, the hole transport layer 122 includes the first hole transport layer 122a, the second hole transport layer 122b, and the third hole transport layer 122c. The thickness of the first hole transport layer 122a is, for example, equal to or greater than 30 nm and equal to or smaller than 100 nm. The thickness of the second hole transport layer 122b is, for example, equal to or greater than 10 nm and equal to or smaller than 40 nm. The thickness of the third hole transport layer 122c is, for example, equal to or greater than 10 nm and equal to or smaller than 40 nm. The first hole transport layer 122a is formed using the first hole transporting material, and the second hole transport layer 122b and the third hole transport layer 122c are formed using the second hole transporting material. The first hole transporting material is a polymer material having a molecular weight which is greater than that of the second hole transporting material. The first hole transporting material is a polymeric hole transporting material. For example, triphenylamine-based materials such as poly[(9,9-dioctylfluorenyl-2,7-diyl)-co-(4,4'-(N-(4-sec-butylphenyl))diphenylamine)] (TFB) are exemplified. In addition, polymeric hole transporting materials including anthracene derivatives, carbazole derivatives, polythiophene derivatives, polyfluorene derivatives, polyparaphenylene vinylene derivatives, and polyparaphenylene derivatives are exemplified. The material is not limited thereto. The second hole transporting material is a low molecular hole transporting material. For example, α-NPD (bis(N-(1-naphthyl-N-phenyl)benzidine)), m-MTDATA (4,4',4"-tris[phenyl(m-tolyl)amino]triphenylamine), TCTA (4,4', 4"-tri(N-carbazole)triphenylamine), and 2-TNATA (4,4',4"-tris[2-naphthyl (phenyl)amino]triphenylamine) are exemplified. In addition, low molecular hole transporting materials including the following are exemplified: triphenylamine derivatives, oxadiazole derivatives, styrylamine derivatives, triazole derivatives, oxadiazole derivatives, imidazole derivatives, polyarylalkane derivatives, phenylenediamine derivatives, arylamine derivatives, oxazole derivatives, styrylanthracene derivatives, fluorenone derivatives, hydrazone derivatives, stilbene derivatives, triphenylene derivatives, and azatriphenylene derivatives. However, the material is not limited thereto. When the layer is formed by a coating method, the material is dissolved in an organic solvent and then the film formation is performed with the resultant. Examples of the organic solvent include toluene, xylene, anisole, cyclohexanone, dodecylbenzene, cyclohexanol, tetralin, mesitylene, pseudocumene, dihydrobenzofuran, cyclohexylbenzene, 1-methylnaphthalene, p-anisyl alcohol, dimethylnaphthalene, 3-methylbiphenyl, 4-methylbiphenyl, 3-isopropylbiphenyl, monoisopropylnaphthalene, tetrahydrofuran, dichloroethane, chloroform, ethyl benzoate, and butyl benzoate. However, the organic solvent is not limited to the above. The above materials may be singly used or may be used in mixture of two kinds or more thereof.

The first hole transport layer 122a is formed by performing coating with the first hole transporting material. The second hole transport layer 122b is formed by performing coating with the second hole transporting material. In detail, coating with the second hole transporting material for the second hole transport layer 122b is performed after performing coating with the first hole transporting material for the first hole transport layer 122a and drying. Therefore, an interface is provided between the first hole transport layer 122a and the second hole transport layer 122b. The first hole transport layer 122a and the second hole transport layer 122b are formed by, for example, using a spin-coating method or may be formed by using another coating method (for example, ink jet method).

The third hole transport layer 122c is formed by using a vapor deposition method. As described above, the second hole transport layer 122b and the third hole transport layer 122c are formed by using film formation methods which are different from each other. Therefore, regardless of both the second hole transport layer 122b and the third hole transport layer 122c being formed using the second hole transporting material, an interface is provided between the second hole transport layer 122b and the third hole transport layer 122c. Moreover, the refractive index of the second hole transport layer 122b is different from the refractive index of the third hole transport layer 122c. For example, the refractive index of the second hole transport layer 122b is lower than the refractive index of the third hole transport layer 122c.

The light emitting layer 123 is formed using a material which emits light by re-combination of electrons and holes. The light emission color of the light emitting layer 123 (that is, light emission color of the light emitting unit 140) may be any color. For example, blue (having a peak wavelength which is equal to or greater than 430 nm and equal to or smaller than 480 nm), green (having a peak wavelength which is equal to or greater than 500 nm and equal to or smaller than 550 nm) or red (having a peak wavelength which is equal to or greater than 600 nm and equal to or smaller than 680 nm) is the light emission color of the light emitting layer. As the material of the light emitting layer 123, any material may be used so long as the material is an organic material that emits light.

A hole blocking layer 124 is in contact with a surface of the light emitting layer 123 on an opposite side of the hole transport layer 122, and thus suppresses an occurrence of a situation in which holes penetrate the light emitting layer 123 and then reach an electron transport layer 125 or an electron injection layer 126. The hole blocking layer 124 is formed using, for example, a material through which electrons can move (organic material having electron mobility). The thickness of the hole blocking layer 124 is equal to or greater than 5 nm and equal to or smaller than 50 nm, for example. The organic layer 120 need not include the hole blocking layer 124.

The electron transport layer 125 is formed using a material through which electrons move (organic material having electron mobility). As such a material, for example, nitrogen-containing aromatic heterocyclic derivatives, aromatic hydrocarbon ring derivatives, dibenzofuran derivatives, dibenzothiophene derivatives, and silole derivatives are exemplified. The thickness of the electron transport layer 125 is equal to or greater than 5 nm and equal to or smaller than 100 nm, for example.

The electron injection layer 126 is formed using alkaline metal compounds such as LiF, metal oxides represented by aluminum oxides, or metal complexes represented by lithium 8-hydroxyquinolate (Liq) and the like. The thickness of the electron injection layer 126 is equal to or greater than 0.1 nm and equal to or smaller than 10 nm, for example.

The organic layer 120 may further include an electron inhibition layer. The electron inhibition layer is positioned between the hole transport layer 122 and the light emitting layer 123 and suppresses an occurrence of a situation in which electrons penetrating the light emitting layer 123 reach the hole transport layer 122 or the hole injection layer 121. The electron inhibition layer can be formed using at least one of materials through which holes move (organic materials having hole mobility), for example. The thickness of the electron inhibition layer is equal to or greater than 5 nm and equal to or smaller than 50 nm, for example.

Figure 2:
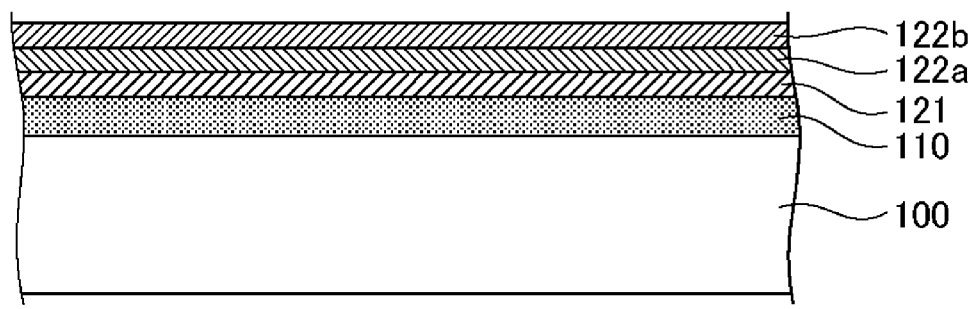
Figure 2:
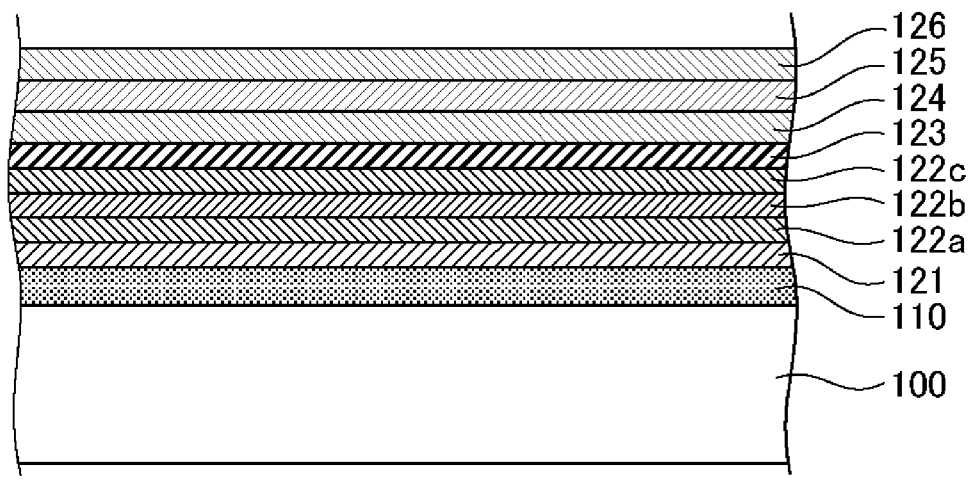

Each of FIG. 2 are sectional views illustrating a method of manufacturing the light emitting unit 140 in the light emitting device 10. The method of manufacturing the light emitting device 10 includes a step (first step) of performing coating with the hole injection material, a step (second step) of performing coating with the first hole transporting material, a step (third step) of performing coating with the second hole transporting material, a step (fourth step) of depositing the second hole transporting material, and a step (fifth step) of depositing the light emitting material. The second step is performed after the first step. The third step is performed after the second step. The fourth step is performed after the third step. The fifth step is performed after the fourth step. Details thereof will be described below.

First, as illustrated in FIG. 2(a), the first electrode 110 is formed on the substrate 100, for example, by using a vapor deposition method or a sputtering method. Then, coating with the hole injection material is performed, for example, by using a coating method such as an ink jet method or a spin-coating method. Then, drying is performed. Thus, the hole injection layer 121 is formed (first step).

Then, coating with the first hole transporting material is performed, for example, by using a coating method such as an ink jet method or a spin-coating method. Then, drying is performed. Thus, the first hole transport layer 122a is formed (second step). Then, coating with the second hole transporting material is performed, for example, by using a coating method such as an ink jet method or a spin-coating method. Then, drying is performed. Thus, the second hole transport layer 122b is formed (third step).

Then, as illustrated in FIG. 2(b), the second hole transporting material is deposited on the second hole transport layer 122b by using a vacuum vapor deposition method. Thus, the third hole transport layer 122c is formed (fourth step). Then, the light emitting layer 123 is formed by using a vacuum vapor deposition method (fifth step). Then, the hole blocking layer 124 and the electron transport layer 125 are formed by using a vacuum vapor deposition method. The electron injection layer 126 is formed by using a vacuum vapor deposition method (sixth step). In this manner, the organic layer 120 is formed.

Then, the second electrode 130 is formed on the organic layer 120. The second electrode 130 is formed by, for example, using a vapor deposition method or a sputtering method. In this manner, the light emitting device 10 illustrated in FIG. 1 is formed.

In the embodiment, the hole injection layer 121 and the first hole transport layer 122a are formed by using a coating method, and the third hole transport layer 122c and the light emitting layer 123 are formed by using a vapor deposition method. In this case, a portion of layers of the hole transport layer 122 is formed by the coating method, and the remaining layer of the hole transport layer 122 is formed by the vapor deposition method. Therefore, mobility of holes may decrease at an interface between the layer of the hole transport layer 122, which is formed by the coating method, and the layer thereof, which is formed by the vapor deposition method. On the contrary, in the embodiment, the second hole transport layer 122b is provided between the first hole transport layer 122a and the third hole transport layer 122c. The second hole transport layer 122b is formed using the same material as that of the third hole transport layer 122c. Thus, it is possible to suppress the above-described decrease of mobility of holes. Accordingly, it is possible to suppress degradation in light emission efficiency of the light emitting unit 140.

Figures 11, 12:
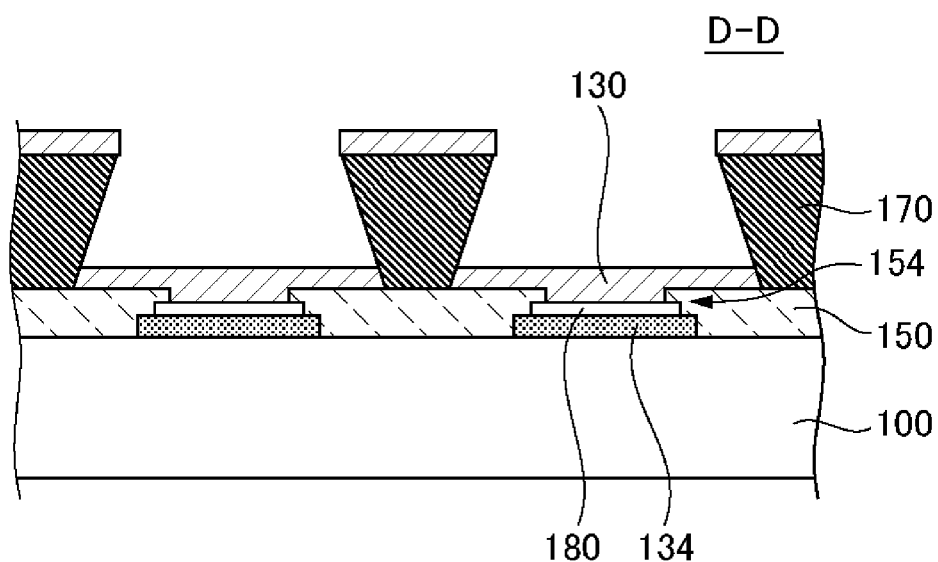
FIG. 11 is a sectional view taken along line D-D in FIG. 7.
FIG. 12 is a table illustrating external quantum efficiency and life spans of the light emitting device according to the embodiment and a light emitting device according to a comparative example.

FIG. 12 is a table illustrating external quantum efficiency (light emission efficiency) and life spans of the light emitting device 10 described in the embodiment and a light emitting device 10 according to a comparative example.

Specifically, the light emitting device 10 in the embodiment has a configuration as follows. First, the first electrode 110 is an ITO having a thickness of 110 nm. The organic layer 120 does not include the hole blocking layer 124. The hole injection layer 121 is a PEDOT-PSS having a thickness of 50 nm. The first hole transport layer 122a is TFB having a thickness of 50 nm. The second hole transport layer 122b is 2-TNATA having a thickness of 10 nm. The third hole transport layer 122c is 2-TNATA having a thickness of 15 nm. The electron transport layer 125 is Alq3 having a thickness of 30 nm. The electron injection layer 126 is LiF having a thickness of 1 nm. The light emitting layer 123 is a blue light emitting layer having a thickness of 20 nm. The second electrode 130 is Al having a thickness of 100 nm. The first electrode 110 is formed by a sputtering method, the hole injection layer 121, the first hole transport layer 122a, and the second hole transport layer 122b are formed by a spin-coating method, and the remaining layers are formed by a vacuum vapor deposition method.

The light emitting device 10 according to the comparative example has the same configuration as the above-described light emitting device 10 except that the second hole transport layer 122b is not provided.

The external quantum efficiency (light emission efficiency) and the life span were examined in a manner that a DC current having a current density of 5 mA/cm2 was applied and luminance of light emitted by the light emitting device 10 was measured. In FIG. 12, values in the comparative example are shown in a form of relative values to those in the embodiment. The external quantum efficiency was indicated by a value just after light emission starts. For the life span, a time until the external quantum efficiency (emission luminance of the light emitting device 10) reaches 70% of the value just after light emission starts was defined as a cumulative light emission time. As a result of the measurement, 5288 hours in the embodiment and 4232 hours in the comparative example are obtained, and the life spans are obtained according to the ratio between both the obtained values.

From FIG. 12, it is understood that, even though the second hole transport layer 122b is provided, the external quantum efficiency just after using the light emitting device 10 starts is hardly degraded. In addition, the following are understood. That is, when the second hole transport layer 122b is provided, it is possible to extend the life span of the light emitting device 10 while emission luminance per unit applied current is maintained, that is, it is possible to suppress degradation in light emission efficiency of the light emitting device 10.

Example 1

Figure 3:
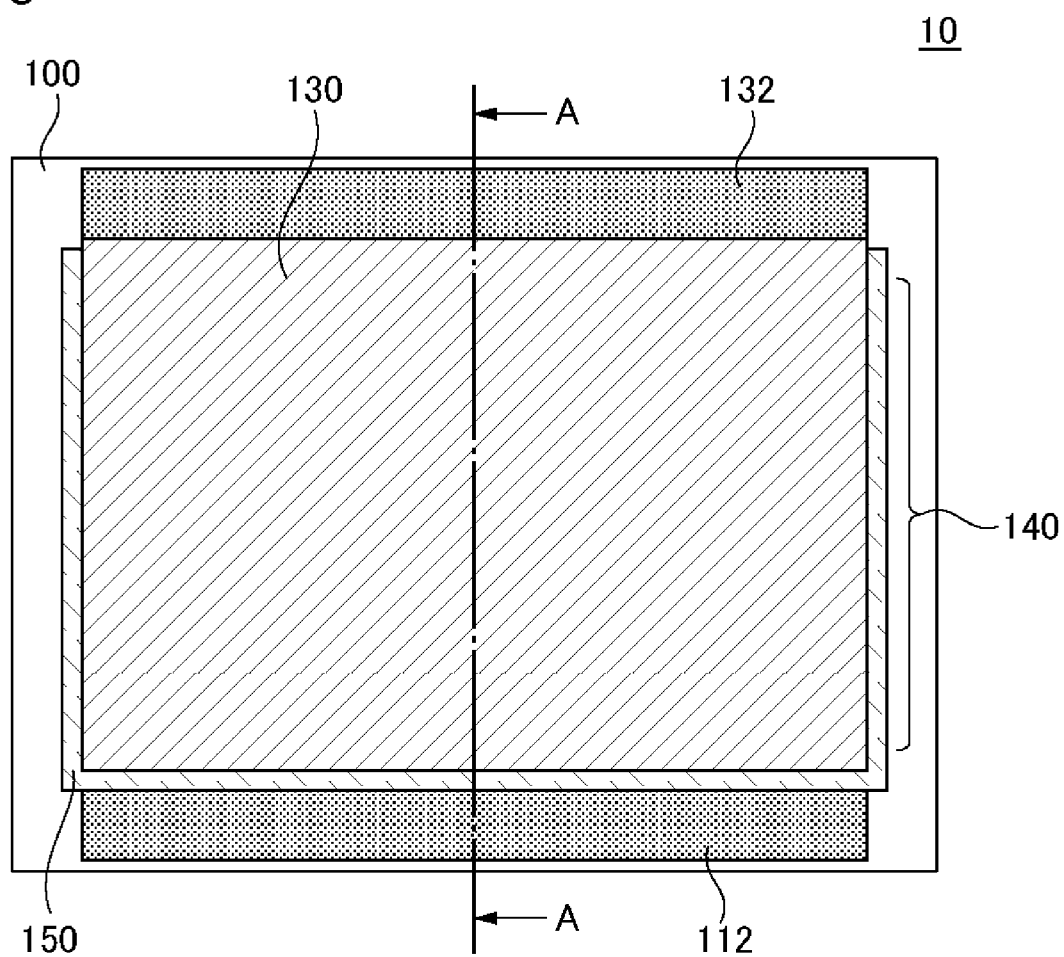
FIG. 3 is a plan view illustrating a light emitting device according to Example 1.
Figure 4:
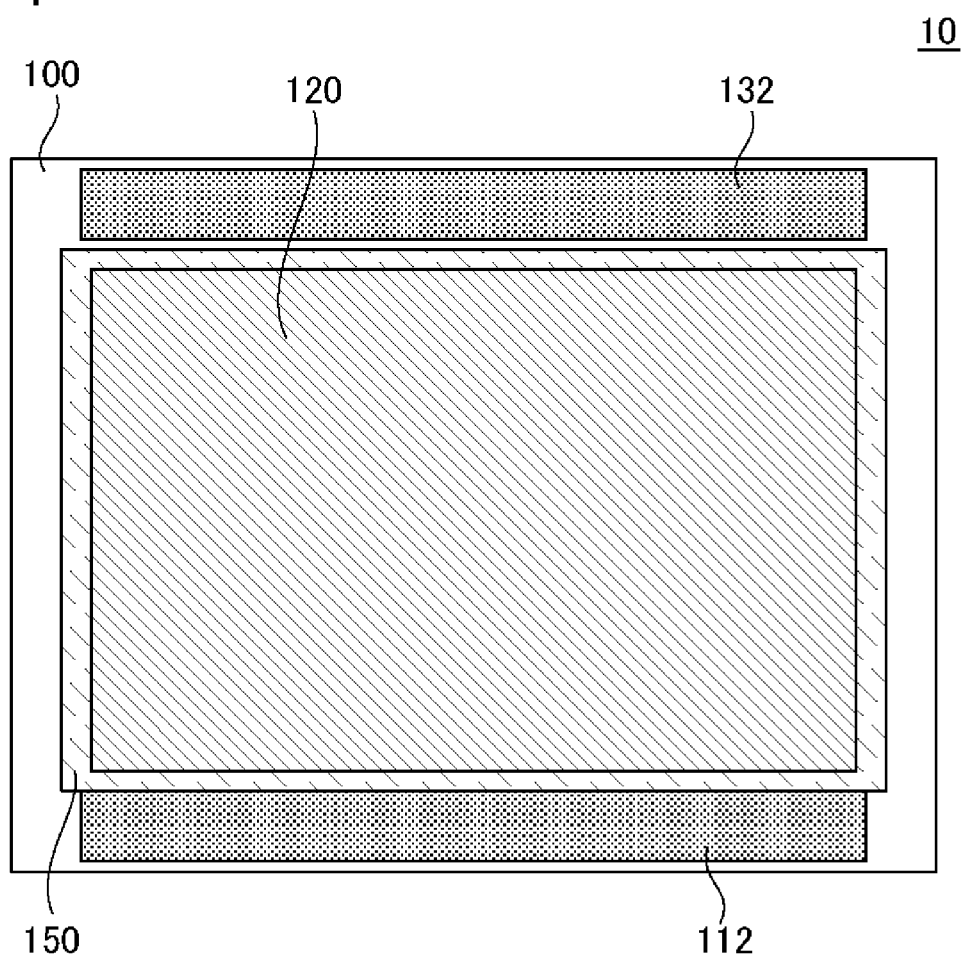
FIG. 4 is a view in which a second electrode is removed from FIG. 3.
Figure 5:
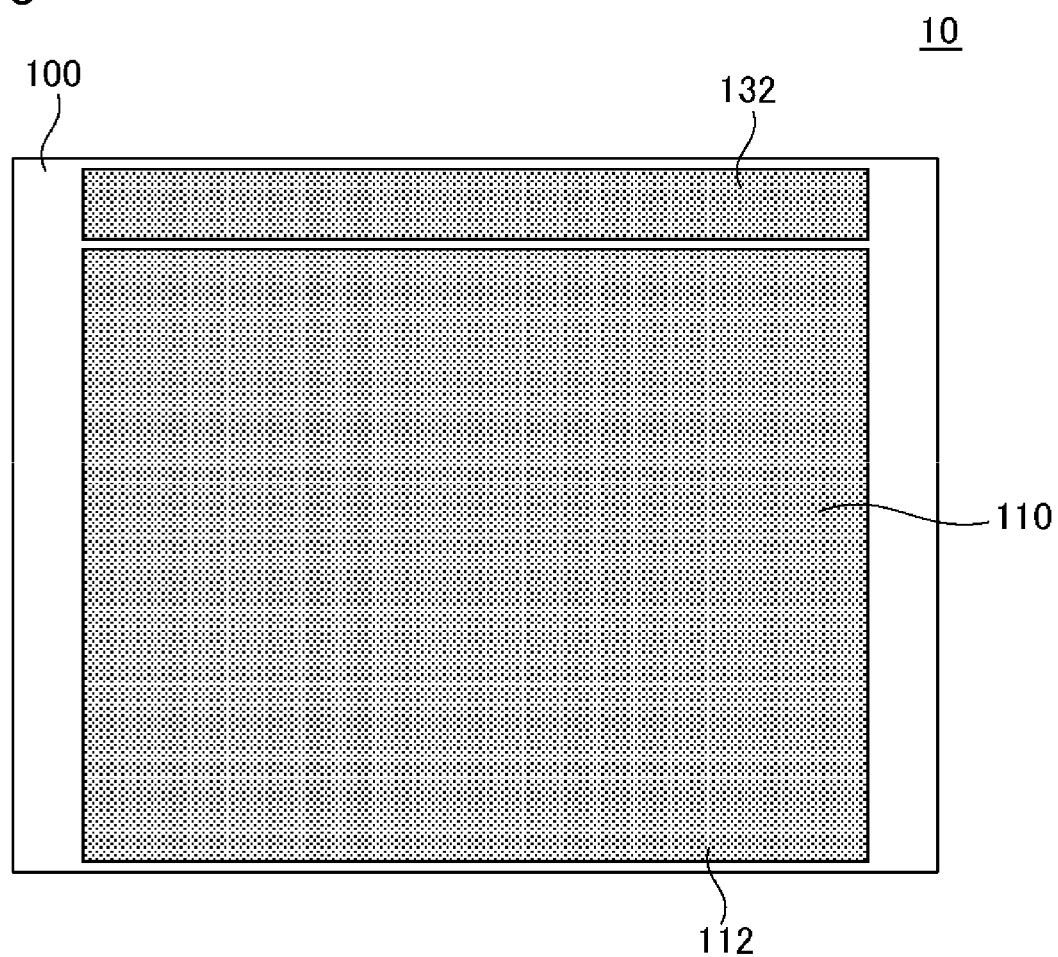
FIG. 5 is a view in which an organic layer and an insulating layer are removed from FIG. 4.
Figure 6:
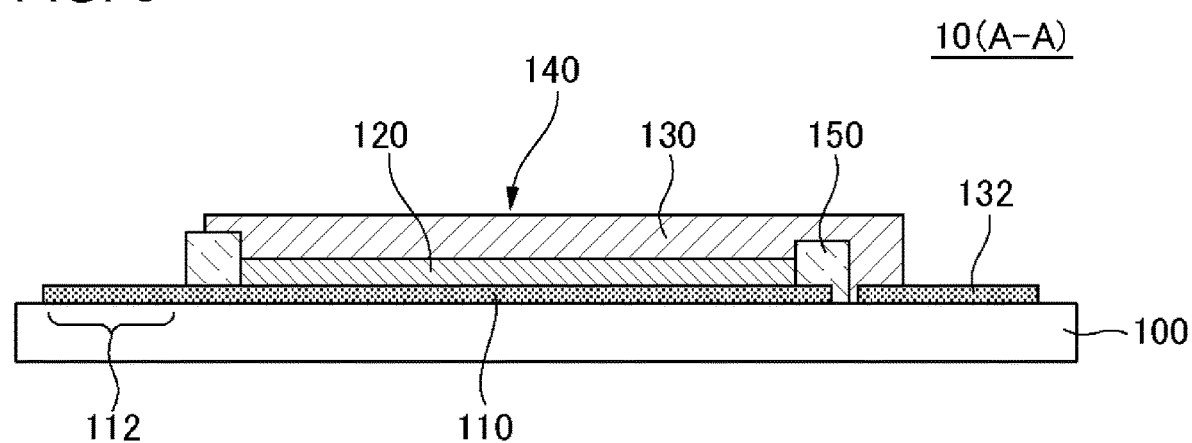
FIG. 6 is a sectional view taken along line A-A in FIG. 3.

FIG. 3 is a plan view illustrating the light emitting device 10 according to Example 1. FIG. 4 is a view in which the second electrode 130 is removed from FIG. 3. FIG. 5 is a view in which the organic layer 120 and the insulating layer 150 are removed from FIG. 4. FIG. 6 is a sectional view taken along line A-A in FIG. 3. The light emitting device 10 according to Example 1 is a lighting device. The light emitting unit 140 is formed on substantially the entire surface of the substrate 100.

In detail, the first electrode 110, a first terminal 112, and a second terminal 132 are formed on one surface of the substrate 100. The first terminal 112 and the second terminal 132 have a layer formed using the same material as that of the first electrode 110. This layer is formed in the same step as that for the first electrode 110. The layer in the first terminal 112 formed by the same material as that of the first electrode 110 is integrated with the first electrode 110. On the other hand, the second terminal 132 is separated from the first electrode 110.

The first terminal 112 and the second terminal 132 are respectively positioned on sides which are opposite to each other sandwiching the first electrode 110. In the example illustrated in the drawings, the substrate 100 is rectangular. The first terminal 112 is formed along one side of the substrate 100. The second terminal 132 is formed along a side on an opposite side of the first terminal 112 among the four sides of the substrate 100.

A region of the substrate 100 to be formed with the organic layer 120 is surrounded by the insulating layer 150. The insulating layer 150 is formed using a material obtained by including a photosensitive material in a resin material such as polyimide. The insulating layer is formed to have a predetermined shape through exposure and developing steps. The insulating layer 150 is formed after the first electrode 110 has been formed and before the organic layer 120 is formed. The insulating layer 150 need not be formed.

The organic layer 120 is formed on the inner side of a region surrounded by the insulating layer 150. The configuration of the organic layer 120 is as described in the embodiment. The second electrode 130 is formed on the organic layer 120. A portion of the second electrode 130 extends over the second terminal 132 by crossing over the insulating layer 150.

According to Example 1, the organic layer 120 has a configuration described in the embodiment and is manufactured by using the method described in the embodiment. Therefore, regardless of that the layer portion of the hole transport layer 122 being formed by the coating method and the remaining layer of the hole transport layer 122 being formed by the vapor deposition method, it is possible to suppress the decrease of mobility of holes in the hole transport layer 122. Accordingly, it is possible to suppress degradation in light emission efficiency of the light emitting unit 140.

Example 2

Figure 7:
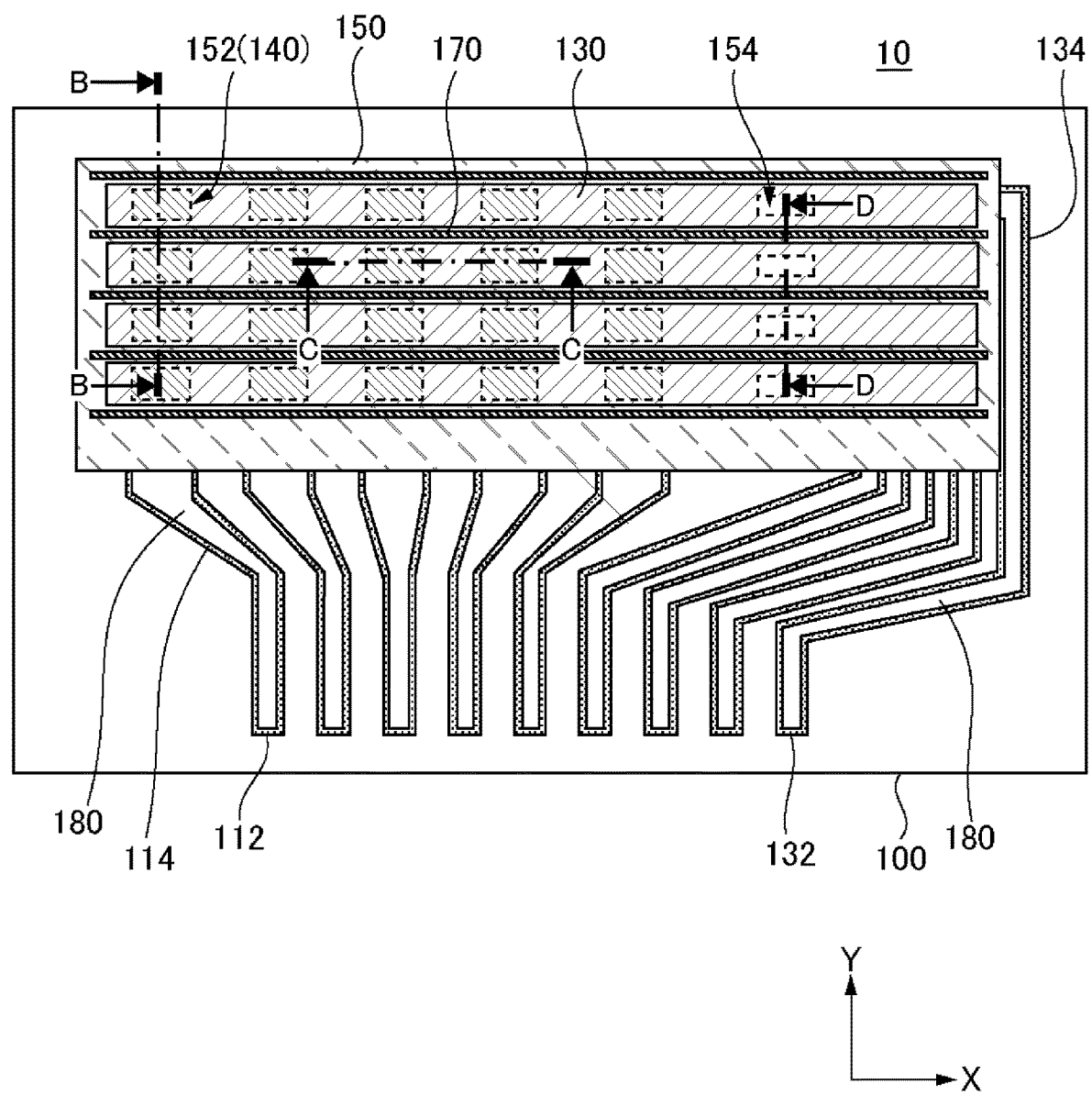
FIG. 7 is a plan view illustrating a light emitting device according to Example 2.
Figure 8:
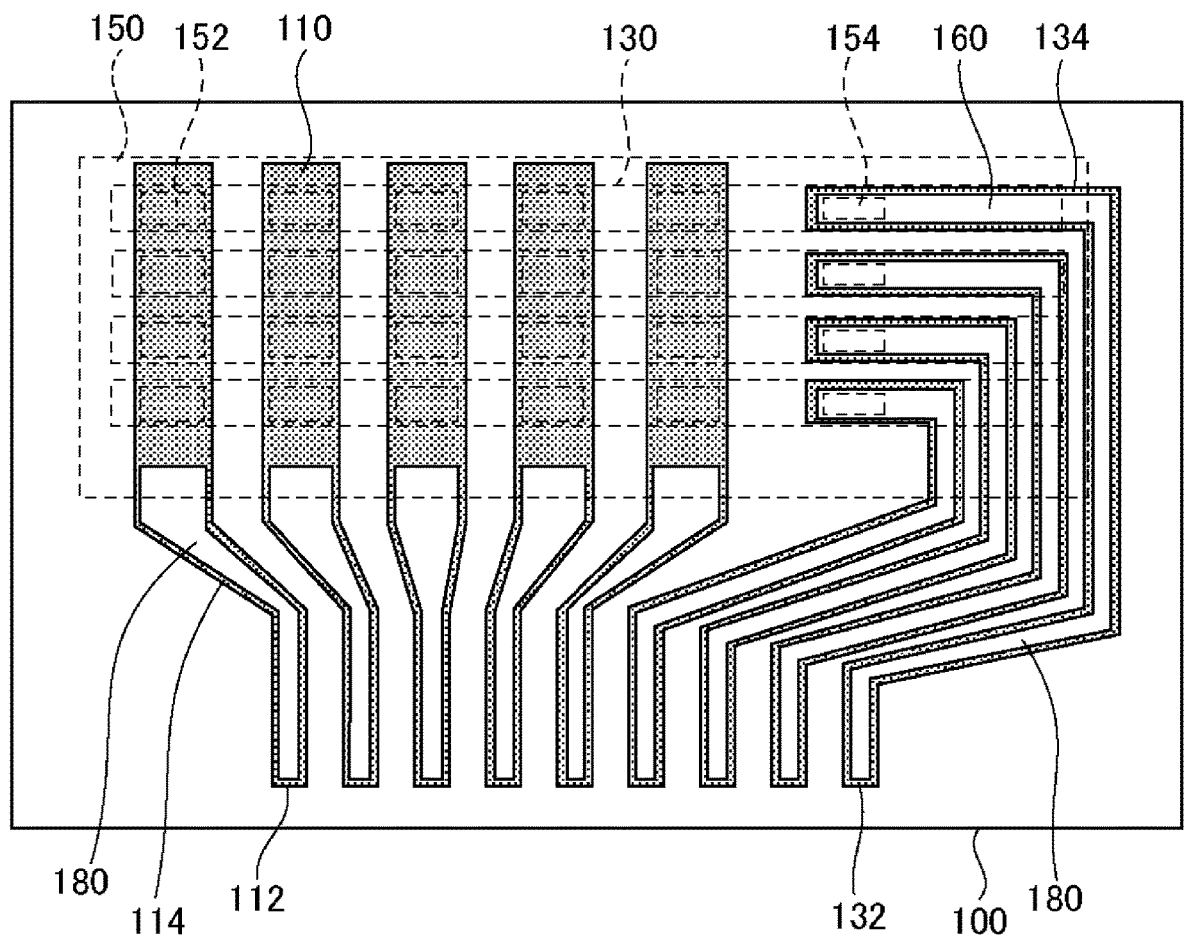
FIG. 8 is a view in which a partition wall, a second electrode, an organic layer, and an insulating layer are removed from FIG. 7.
Figure 9:
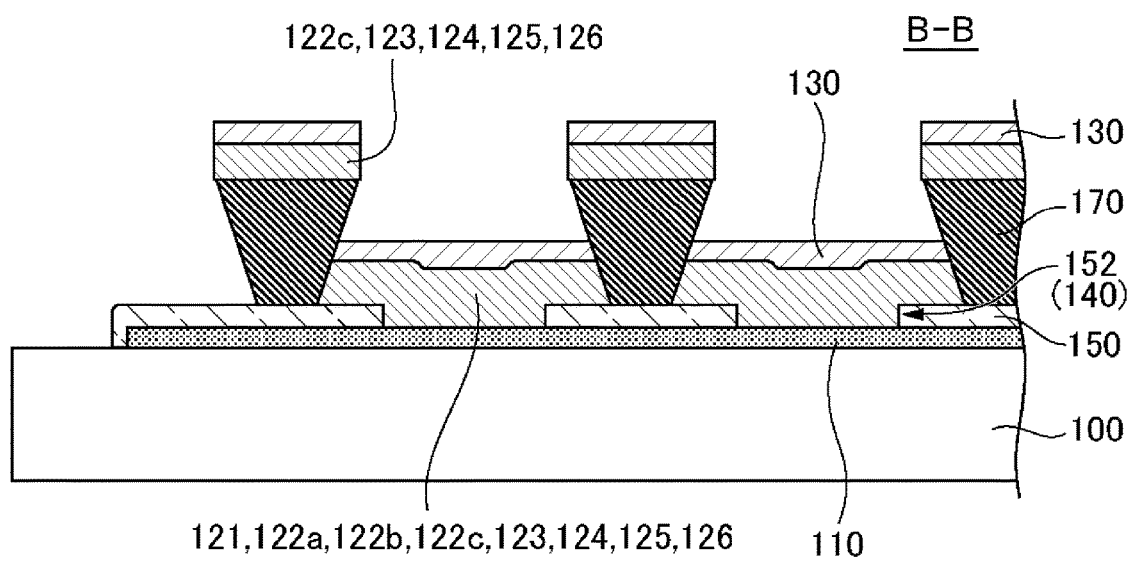
FIG. 9 is a sectional view taken along line B-B in FIG. 7.
Figure 10:
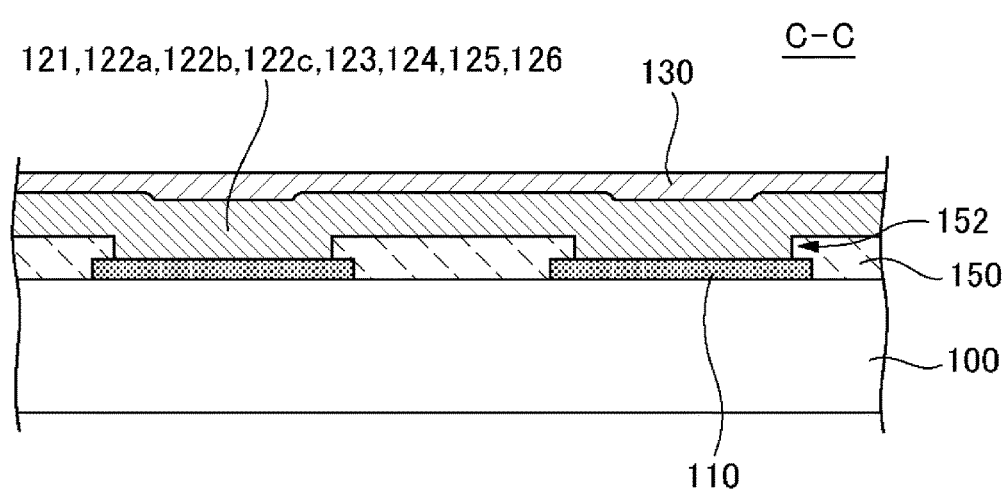
FIG. 10 is a sectional view taken along line C-C in FIG. 7.

FIG. 7 is a plan view illustrating the light emitting device 10 according to Example 2. FIG. 8 is a view in which the partition wall 170, the second electrode 130, the organic layer 120, and the insulating layer 150 are removed from FIG. 7. FIG. 9 is a sectional view taken along line B-B in FIG. 7. FIG. 10 is a sectional view taken along line C-C in FIG. 7. FIG. 11 is a sectional view taken along line D-D in FIG. 7.

The light emitting device 10 according to Example 2 is a display. The light emitting device 10 includes the substrate 100, the first electrode 110, the light emitting unit 140, the insulating layer 150, a plurality of openings 152, a plurality of openings 154, a plurality of lead wires 114, the organic layer 120, the second electrode 130, a plurality of lead wires 134, and a plurality of partition walls 170.

The first electrode 110 linearly extends in a first direction (Y-direction in FIG. 7). The end of the first electrode 110 is connected to the lead wire 114.

The lead wire 114 is a wire that connects the first electrode 110 to the first terminal 112. In the example illustrated in the drawings, one end of the lead wire 114 is connected to the first electrode 110 and the other end of the lead wire 114 serves as the first terminal 112. In the example illustrated in the drawings, the first electrode 110 and the lead wire 114 are integrated. A conductive layer is formed on the first terminal 112 and on the lead wire 114. The conductive layer 180 is formed using metal having a resistance lower than that of the first electrode 110, for example, Al or Ag. A portion of the lead wire 114 is covered by the insulating layer 150.

As illustrated in FIGS. 7 and 9 to 11, the insulating layer 150 is formed on the plurality of first electrodes 110 and in regions between the plurality of first electrodes. The plurality of openings 152 and the plurality of openings 154 are formed in the insulating layer 150. The plurality of second electrodes 130 extend in parallel in a direction intersecting the first electrode 110 (for example, direction orthogonal to the first electrode: X-direction in FIG. 7). The partition walls 170 which will be described later in detail extend between the plurality of second electrodes 130. The openings 152 are positioned at intersection points between the first electrodes 110 and the second electrodes 130 in plan view. The plurality of openings 152 is arranged to form a matrix.

The openings 154 are positioned in regions overlapping each of one ends of the plurality of second electrodes 130 in plan view. The openings 154 are arranged along one side of a matrix formed by the openings 152. In a case of being viewed in a direction along the one side (for example, Y-direction in FIG. 7, that is, direction along the first electrode 110), the openings 154 are arranged at a predetermined interval. A portion of the lead wire 134 is exposed from the opening 154. The lead wire 134 is connected to the second electrode 130 via the opening 154.

The lead wire 134 is a wire that connects the second electrode 130 to the second terminal 132 and includes a layer formed of the same material as that of the first electrode 110. One end of the lead wire 134 is positioned below the opening 154, and the other end of the lead wire 134 is drawn to the outside of the insulating layer 150. In the example illustrated in the drawings, the other end of the lead wire 134 serves the second terminal 132. The conductive layer 180 is formed on the second terminal 132 and on the lead wire 134. A portion of the lead wire 134 is covered by the insulating layer 150.

The organic layer 120 is formed in a region overlapping each of the openings 152. The configuration of the organic layer 120 is as described in the embodiment. The light emitting unit 140 is positioned in each region overlapping the openings 152.

In the example illustrated in FIGS. 9 and 10, a case in which all the layers constituting the organic layer 120 protrude to the outside of the opening 152 is illustrated. As illustrated in FIG. 7, the organic layer 120 may or may not be continuously formed in a region between the openings 152 which are adjacent to each other, in a direction in which the partition walls 170 extend. As illustrated in FIG. 11, the organic layer 120 is not formed in the openings 154.

As illustrated in FIGS. 7 and 9 to 11, the second electrode 130 extends in a second direction intersecting the first direction (X-direction in FIG. 7). The partition wall 170 is formed between the second electrodes 130 which are adjacent to each other. The partition wall 170 extends in parallel to the second electrode 130, that is, extends in the second direction. The base of the partition wall 170 is, for example, the insulating layer 150. The partition wall 170 is made of, for example, a photosensitive resin such as a polyimide resin and is formed to have a desired pattern by being exposed and developed. The partition wall 170 may be formed of a resin other than the polyimide resin, for example, may be formed of an epoxy resin, an acrylic resin, or an inorganic material such as silicon dioxide.

The partition wall 170 has a shape having a trapezoidal section (inverted trapezoid) which is reversed upside down. That is, the width of the upper surface of the partition wall 170 is larger than the width of the lower surface of the partition wall 170. Therefore, when the partition wall 170 is formed ahead of the second electrode 130, the plurality of second electrodes 130 can be formed at once by forming the second electrodes 130 on one surface side of the substrate 100 by the vapor deposition method or the sputtering method.

The partition wall 170 also has a function of dividing the organic layer 120. For example, the layers formed by the coating method among the layers constituting the organic layer 120 (for example, hole injection layer 121, first hole transport layer 122a, and second hole transport layer 122b) are formed by coating the regions between the partition walls 170 with the coating material. On the other hand, the layers in the organic layer 120 formed by the vapor deposition method (for example, third hole transport layer 122c, light emitting layer 123, hole blocking layer 124, electron transport layer 125, and electron injection layer 126) are not formed on the side surface of the partition wall 170, and thus are divided by the partition walls 170. The layer of the organic layer 120 which is formed by the vapor deposition method is also formed on the upper surface of the partition wall 170.

Each layer of the organic layer 120 (hole injection layer 121, each layer of hole transport layer 122, light emitting layer 123, hole blocking layer 124, electron transport layer 125, and electron injection layer 126) is formed on the inner side of the opening 152. On the other hand, only the layers of the organic layer 120, which are formed by the vapor deposition method, specifically, only a portion of the layers of the hole transport layer 122 (further specifically, the third hole transport layer 122c), the light emitting layer 123, the hole blocking layer 124, the electron transport layer 125, and the electron injection layer 126 are formed on the upper surface of the partition wall 170. The hole injection layer 121 and the remaining layers (specifically, first hole transport layer 122a and second hole transport layer 122b) of the hole transport layer 122 are not formed on the above upper surface of the partition wall 170. Therefore, the organic layer positioned on the partition wall 170 is thinner than the organic layer 120 positioned in the opening 152.

In a case where the light emitting device 10 is a color display, the light emitting device 10 includes, for example, a red light emitting unit 140, a green light emitting unit 140, and a blue light emitting unit 140. Each of organic layers 120 of the light emitting units 140 has the configuration in the above-described embodiment.

Next, the method of manufacturing the light emitting device 10 in Example 2 will be described. First, the first electrode 110 and the lead wires 114 and 134 are formed on the substrate 100. The method of forming the above components is similar to the method of forming the first electrode 110 in the embodiment.

Then, the conductive layer 180 is formed on the lead wire 114, the first terminal 112, the lead wire 134, and the second terminal 132. Then, the insulating layer 150 is formed, and then the partition wall 170 is formed. Then, the layers of the organic layer 120 are formed. The methods of forming the layers of the organic layer 120 are as described in the embodiment. Then, the second electrode 130 is formed.

In Example 2, the organic layer 120 also has the configuration described in the embodiment and is also manufactured by using the method described in the embodiment. Therefore, regardless of the layer portion of the hole transport layer 122 being formed by the coating method and the remaining layer of the hole transport layer 122 being formed by the vapor deposition method, it is possible to suppress the decrease of mobility of holes in the hole transport layer 122. Accordingly, it is possible to suppress degradation in light emission efficiency of the light emitting unit 140.

Hitherto, the embodiment and the examples are described with reference to the drawings. However, these are just an example of the present invention, and various configurations other than the above descriptions can be employed.

The invention claimed is:

1. A light emitting device comprising:
a hole injection layer;
a first organic layer on the hole injection layer, the first organic layer comprising a first hole transporting material;
a second organic layer on the first organic layer, the second organic layer comprising a second hole transporting material;
a third organic layer on the second organic layer, the third organic layer comprising the second hole transporting material; and
a light emitting layer on the third organic layer,
wherein a refractive index of the second organic layer is different from a refractive index of the third organic layer.

2. A light emitting device comprising:
a hole injection layer;
a first organic layer on the hole injection layer, the first organic layer comprising a first hole transporting material;
a second organic layer on the first organic layer, the second organic layer comprising a second hole transporting material;
a third organic layer on the second organic layer, the third organic layer comprising the second hole transporting material;
a light emitting layer on the third organic layer;
a substrate;
an insulating layer on the substrate, the insulating layer comprising a plurality of openings; and
a partition wall on a portion of the insulating layer located between adjacent openings,
wherein the hole injection layer, the first organic layer, the second organic layer, the third organic layer, and the light emitting layer are formed on an inner side of each of the openings, and
the first organic layer and the second organic layer are not formed on the partition wall, and the third organic layer and the light emitting layer are formed on the partition wall.

3. A light emitting device comprising:
a hole injection layer;
a first organic layer on the hole injection layer, the first organic layer comprising a first hole transporting material;
a second organic layer on the first organic layer, the second organic layer comprising a second hole transporting material;
a third organic layer on the second organic layer, the third organic layer comprising the second hole transporting material;
a light emitting layer on the third organic layer, wherein the hole injection layer, the first organic layer, the second organic layer, the third organic layer, and the light emitting layer are a part of a light emitting element, and a peak wavelength of light emitted from the light emitting element is equal to or greater than 430 nm and equal to or smaller than 480 nm.

4. A light emitting device comprising:

a substrate;

an insulating layer on the substrate, the insulating layer comprising a plurality of openings;

a partition wall on a portion of the insulating layer located between adjacent openings; and a light emitting element on an inner side of each of the plurality of openings, wherein the light emitting element comprises:
   a hole injection layer;
   a hole transport layer on the hole injection layer; and
   a light emitting layer on the hole transport layer, and the hole injection layer and a portion of the hole transport layer are not formed on the partition wall and the remaining portion of the hole transport layer and the light emitting layer are formed on the partition wall.

\* \* \* \* \*